US007958466B1

(12) United States Patent
Fung

(10) Patent No.: US 7,958,466 B1
(45) Date of Patent: Jun. 7, 2011

(54) METHOD AND APPARATUS FOR CALCULATING A SCALAR QUALITY METRIC FOR QUANTIFYING THE QUALITY OF A DESIGN SOLUTION

(75) Inventor: Ryan Fung, Mississauga (CA)

(73) Assignee: Altera Corporation, San Jose, CA (US)

( * ) Notice: Subject to any disclaimer, the term of this patent is extended or adjusted under 35 U.S.C. 154(b) by 729 days.

(21) Appl. No.: 11/396,777

(22) Filed: Apr. 1, 2006

(51) Int. Cl.
G06F 17/50 (2006.01)
G06F 9/455 (2006.01)
G06F 11/22 (2006.01)

(52) U.S. Cl. .......................... 716/100; 716/108; 716/136
(58) Field of Classification Search .................. 716/1, 4, 716/6, 100, 108, 136
See application file for complete search history.

(56) References Cited

U.S. PATENT DOCUMENTS

| | | | | |
|---|---|---|---|---|
| 5,689,651 A * | 11/1997 | Lozman | ........................... | 705/37 |
| 6,625,797 B1 * | 9/2003 | Edwards et al. | ................. | 716/18 |
| 6,708,139 B2 * | 3/2004 | Rearick et al. | ................. | 702/185 |
| 7,123,548 B1 * | 10/2006 | Uzes | ............................. | 367/135 |
| 7,181,703 B1 * | 2/2007 | Borer et al. | ........................ | 716/3 |
| 7,191,112 B2 * | 3/2007 | Demler et al. | ................... | 703/14 |
| 7,340,696 B1 * | 3/2008 | Jadcherla | ........................ | 716/1 |
| 7,797,674 B1 * | 9/2010 | Brewton et al. | ................ | 717/105 |
| 2004/0210856 A1 * | 10/2004 | Sanie et al. | ........................ | 716/2 |
| 2006/0080076 A1 * | 4/2006 | Lahiri et al. | ..................... | 703/18 |
| 2006/0242617 A1 * | 10/2006 | Bellas et al. | ..................... | 716/18 |

* cited by examiner

Primary Examiner — Stacy A Whitmore
Assistant Examiner — Magid Y Dimyan
(74) Attorney, Agent, or Firm — L. Cho

(57) ABSTRACT

A method for generating a scalar quality metric value for a design solution includes reflectings one or more qualities of the design solution with respect to two or more domains in the system. Other embodiments are also disclosed.

48 Claims, 7 Drawing Sheets

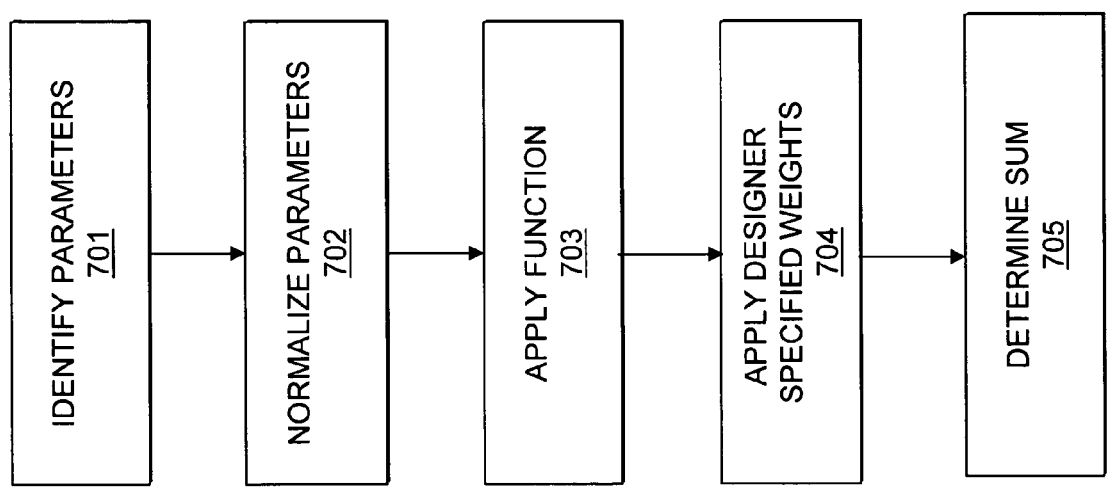

METHOD AND APPARATUS FOR CALCULATING A SCALAR QUALITY METRIC FOR QUANTIFYING THE QUALITY OF A DESIGN SOLUTION

TECHNICAL FIELD

The present invention relates to logic design automation tools. More specifically, the present invention relates to a method and apparatus for calculating a scalar quality metric for quantifying the quality of a design solution.

BACKGROUND

It is not uncommon for logic designs to have multiple timing domains. The multiple timing domains may come from a multiplicity of clocks, or from constraints such as skew constraints, recovery/removal constraints on asynchronous clear/load signals, and IO timing constraints. Long-path and short-path timing constraints may also operate to increase the number of timing domains in a logic design.

Optimization procedures utilized by logic design tools may require that design solutions be summarized with respect to timing. Such procedures may compute a single scalar number to score the "quality" of the design solution. A scalar timing quality metric allows two design solutions to be evaluated with respect to each other by simply comparing their corresponding metric values.

In the past, worst slack was the parameter used by electronic design automation (EDA) tools to compute a single scalar timing quality metric. When a logic design had multiple timing domains, a worst case slack was computed for each domain. The smallest of the timing domain slacks was used as the quality metric value of the design solution. This approach has several drawbacks. Since the quality of a design solution is determined entirely by the performance of the worst domain, this approach was unable to appreciate solutions where the worst domains are equal but where other domains have more preferable solutions. This approach would also prefer solutions that had marginally better worst slack at the cost of significant degradation of other timing domains.

Thus, what is needed is an improved method and apparatus for calculating a scalar quality metric for quantifying the quality of a design solution.

SUMMARY

According to an embodiment of the present invention, a method and apparatus for calculating an improved scalar quality metric for quantifying the quality of a design solution is disclosed. The scalar quality metric avoids blindspots with multiple domains by ensuring that the performance of each domain contributes to the quality scalar metric. According to an embodiment of the present invention, sub-linear functions may be used to generate a scalar quality metric that focuses on domains that fail to meet their constraints or are meeting their constraints with lower margin. According to an embodiment of the present invention, normalization of parameters may be performed in order to generate a scalar quality metric that better reflects the performance between domains.

BRIEF DESCRIPTION OF THE DRAWINGS

The features and advantages of the present invention are illustrated by way of example and are by no means intended to limit the scope of the present invention to the particular embodiments shown.

FIG. 7 is a flow chart illustrating a method for generating a scalar quality metric according to an embodiment of the present invention.

DETAILED DESCRIPTION

In the following description, for purposes of explanation, specific nomenclature is set forth to provide a thorough understanding of embodiments of the present invention. However, it will be apparent to one skilled in the art that specific details in the description may not be required to practice the embodiments of the present invention. In other instances, well-known components, programs, and procedures are shown in block diagram form to avoid obscuring embodiments of the present invention unnecessarily.

Figure 1:
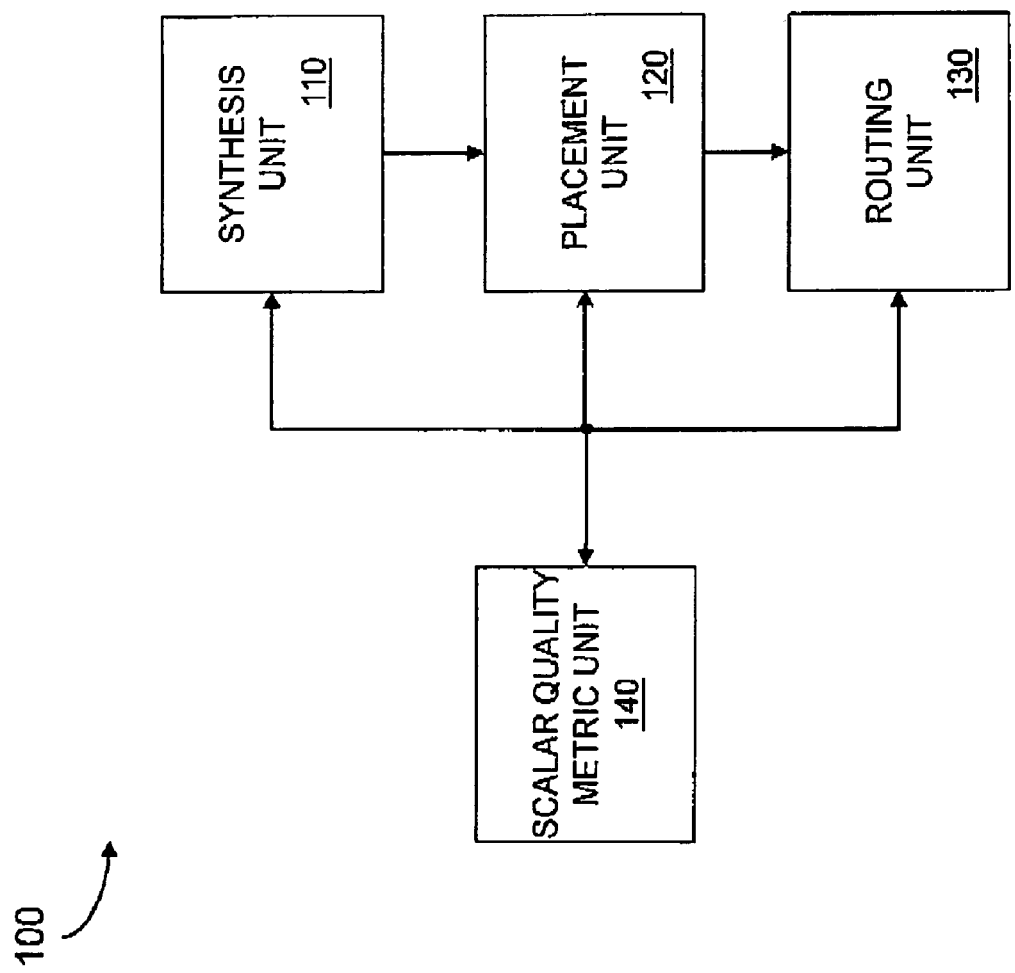
FIG. 1 illustrates a system designer according to an embodiment of the present invention.

FIG. 1 illustrates a system designer 100 according to an embodiment of the present invention. The system designer 100 may be an EDA tool. FIG. 1 illustrates software modules implementing an embodiment of the present invention. According to one embodiment, system design may be performed by a computer system (not shown) executing sequences of instructions represented by the software modules shown in FIG. 1. Execution of the sequences of instructions causes the computer system to support system design as will be described hereafter. In alternate embodiments, hardwire circuitry may be used in place of or in combination with software instructions to implement the present invention. Thus, the present invention is not limited to any specific combination of hardware circuitry and software.

Block 110 represents a synthesis unit. The synthesis unit 210 generates a logic design of a system to be implemented by a target device. According to an embodiment of the system designer 100, the synthesis unit 110 takes a conceptual Hardware Description Language (HDL) design definition and generates an optimized logical representation of the system. The optimized logical representation of the system generated by the synthesis unit 110 may include a representation that has a minimized number of functional blocks and registers, such as logic gates and logic elements, required for the system. Alternatively, the optimized logical representation of the system generated by the synthesis unit 110 may include a representation that has a reduced depth of logic and that generates a lower signal propagation delay. The synthesis unit 110 also determines how to implement the functional blocks and registers in the optimized logic representation utilizing specific resources on a target device, thus creating an optimized "technology-mapped" netlist. The technology-mapped netlist indicates how the resources on the target device can be utilized to implement the system. The technology-mapped netlist may, for example, contain components such as LEs on the target device.

Figure 2:
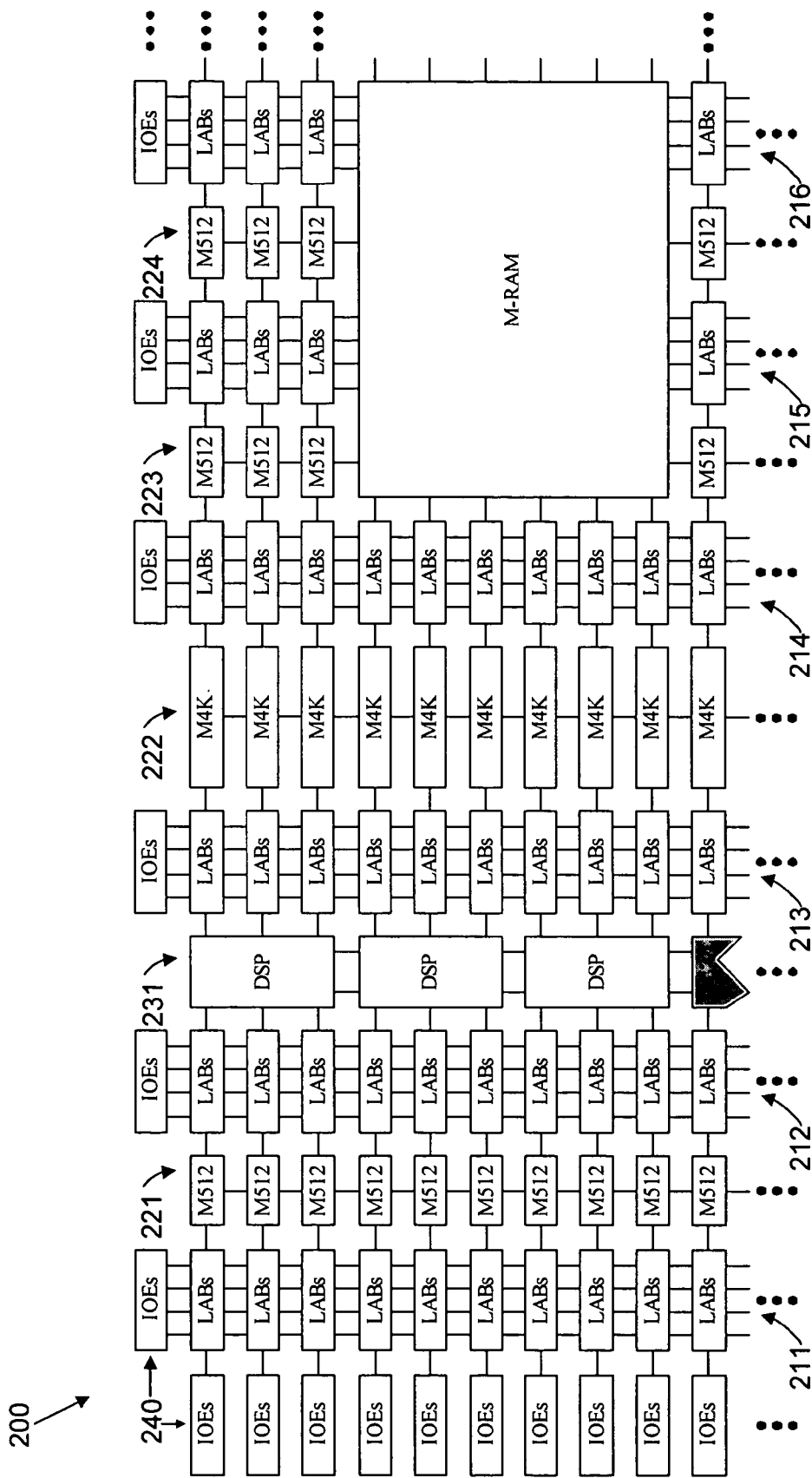
FIG. 2 illustrates a field programmable gate array (FPGA) according to an embodiment of the present invention.

FIG. 2 illustrates an exemplary target device 200 in which a system may be implemented on utilizing an FPGA according to an embodiment of the present invention. According to one embodiment, the target device 200 is a chip having a hierarchical structure that may take advantage of wiring locality properties of circuits formed therein.

The target device 200 includes a plurality of logic-array blocks (LABs). Each LAB may be formed from a plurality of logic blocks, carry chains, LAB control signals, (lookup table) LUT chain, and register chain connection lines. A logic block is a small unit of logic providing efficient implementation of user logic functions. A logic block includes one or more combinational cells and registers. According to one embodiment of the present invention, the logic block may operate similarly to a logic element (LE), or adapive logic module (ALM), such as those found in Stratix™ and Stratix II™ manufactured by Altera® Corporation, or a slice such as those found in Virtex™, Virtex-II™, Virtex-II Pro™, or Virtex-4™ manufactured by Xilinx® Inc. In this embodiment, the logic block may include a four input lookup table (LUT) with a configurable register. LUT chain connections transfer the output of one logic block LUT to the adjacent logic block for fast sequential LUT connections within the same LAB. Register chain connection lines transfer the output of one logic block register to the adjacent logic block's register within a LAB. According to an alternate embodiment of the present invention, the logic block may operate similarly to an adaptive logic module (ALM), such as those found in Stratix II™ manufactured by Altera® Corporation. Columns of LABs are shown as 211-216. It should be appreciated that the logic block may include additional or alternate components.

The target device 200 includes memory blocks. The memory blocks may be, for example, dual port random access memory (RAM) blocks that provide dedicated true dual-port, simple dual-port, or single port memory up to various bits wide at up to various frequencies. The memory blocks may be grouped into columns across the target device in between selected LABs or located individually or in pairs within the target device 200. Columns of memory blocks are shown as 221-224.

The target device 200 includes digital signal processing (DSP) blocks. The DSP blocks may be used to implement multipliers of various configurations with add or subtract features. The DSP blocks include shift registers, multipliers, adders, and accumulators. The DSP blocks may be grouped into columns across the target device 200 and are shown as 231.

The target device 200 includes a plurality of input/output elements (IOEs) 240. Each IOE feeds an I/O pin (not shown) on the target device 200. The IOEs are located at the end of LAB rows and columns around the periphery of the target device 200. Each IOE includes a bidirectional I/O buffer and a plurality of registers for registering input, output, and output-enable signals.

The target device 200 includes LAB local interconnect lines (not shown) that transfer signals between LEs in the same LAB. The LAB local interconnect lines are driven by column and row interconnects and LE outputs within the same LAB. Neighboring LABs, memory blocks, or DSP blocks may also drive the LAB local interconnect lines through direct link connections. The target device 100 also includes a plurality of row and column interconnect lines (not shown) that span fixed distances. Dedicated row and column interconnect lines, route signals to and from LABs, DSP blocks, and memory blocks within the same row and column, respectively.

FIG. 2 illustrates an exemplary embodiment of a target device. It should be appreciated that a system may include a plurality of target devices, such as that illustrated in FIG. 2, cascaded together. It should also be appreciated that the target device may include programmable logic devices arranged in a manner different than that on the target device 200. A target device may also include FPGA resources other than those described in reference to the target device 200. Thus, while the invention described herein may be utilized on the architecture described in FIG. 2, it should be appreciated that it may also be utilized on different architectures, such as those employed by Altera® Corporation in its APEX™, Stratix™, Cyclone™, Stratix™ II, Cyclone™ II, MAX II™, Hardcopy™, Harcopy II™, Stratix GX™, and Stratix II GX™ families of chips and those employed by Xilinx® Inc. in its Spartan™, Spartan-II™, Spartan-3™, Virtex™, Virtex™ II, Virtex™ II Pro, and Virtex IV™ line of chips.

Referring back to FIG. 1, block 120 represents a placement unit 120. The placement unit 120 fits the system on the target device by determining which resources on the target device are to be used for specific functional blocks and registers. According to an embodiment of the system designer 100, the placement unit 120 first determines how to implement portions of the optimized logic design in clusters. Clusters may represent a subset of the components on the target device 100 such as, for example, a LAB having a plurality of logic blocks. In this embodiment, after portions of the optimized logic design are implemented in clusters, the clusters may be placed by assigning the clusters to specific LABs on the target device. Following the placement of the clusters, routing interconnections between the logic blocks may be performed. The placement unit 120 may utilize a cost function in order to determine a good assignment of resources on the target device.

Block 130 represents a routing unit 130. The routing unit 130 determines the routing resources on the target device to use to provide interconnection between the functional blocks and registers on the target device.

Block 140 represents a scalar quality metric unit 140. According to an embodiment of the system designer 100, the scalar quality metric unit 140 computes a scalar quality metric of a design solution for a system on the target device. According to an embodiment of the present invention, the scalar quality metric reflects a quality of the design solution with respect to two or more domains in the system. The domains in the design solution may correspond to, for example, physical locations on the target device, or components associated with a clock or function. It should be appreciated that a domain may be given other definitions. There is no condition that the domains must not overlap. They can overlap partially, or fully, and a domain may include as little as a single connection, or path, and as much as the entire design or device. The scalar quality metric unit 140 may base the scalar quality metric on one or more types of parameters from the domains. The parameters may include timing parameters such as worst slack in each domain, clock frequency in each domain, sum of slacks of all failing paths in each domain, sum of slacks of all paths in each domain, sum of slacks of all negative slack connections in each domain, sum of slack of all connections in each domain, or other timing measurements. The parameters may also or alternatively include power parameters such as the amount of power required to operate resources in each domain.

It should be appreciated that the scalar quality metric unit 140 may generate a scalar quality metric for a design solution generated by the synthesis unit 110, placement unit 120, and/or routing unit 130 utilizing information provided by any one of the units. The scalar quality metric may be used by the synthesis unit 110, placement unit 120, and/or routing unit 130 to compare design solutions generated and to select a best design solution. In other embodiments, a physical synthesis unit may also make use of the scalar quality metric for similar purposes. In other embodiments, the scalar quality metric unit 140 may generate a scalar quality metric for a final logic design solution. The scalar quality metric may be used by the logic design tool or a logic designer to conveniently compare final design solutions to select a favourable one. Altera's Design Space Explorer (DSE) is an example of a tool that compares final design solutions and selects a favorable one.

Figure 3:
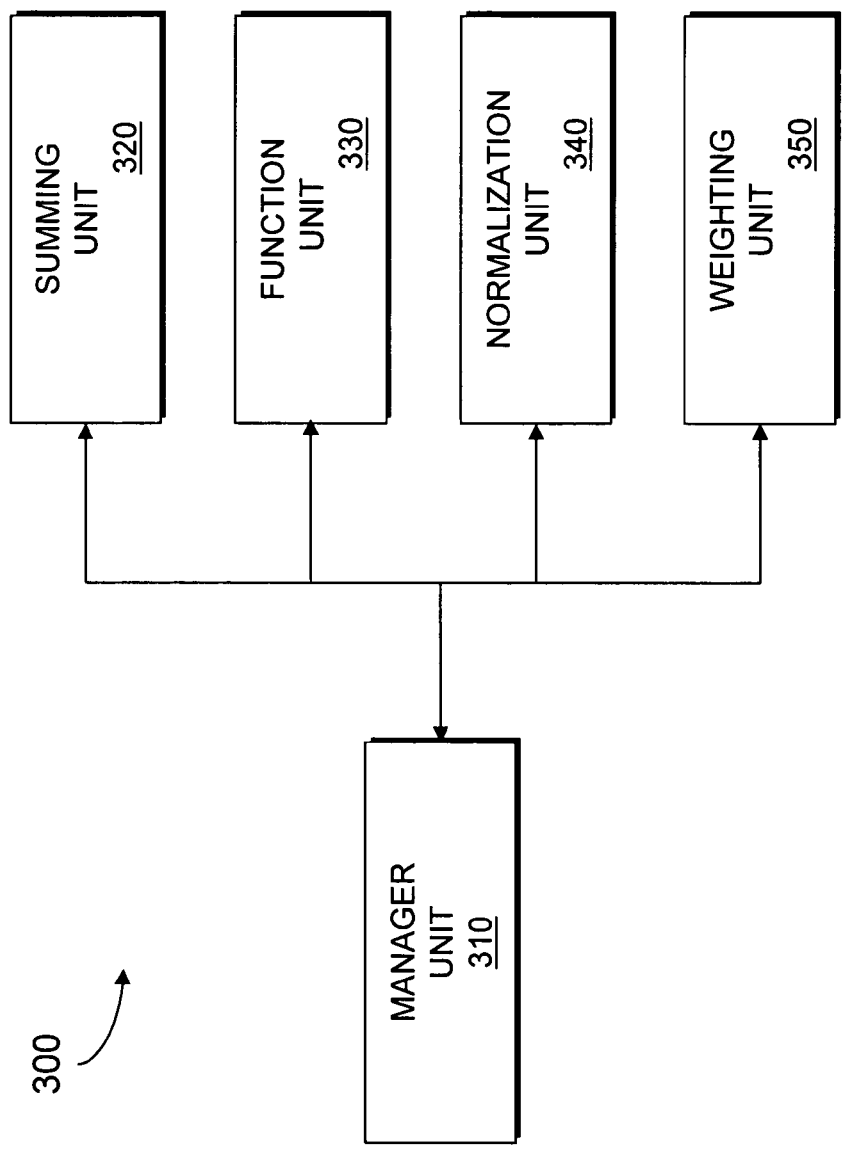
FIG. 3 is a block diagram of a scalar quality metric unit according to an embodiment of the present invention.

FIG. 3 is a block diagram illustrating a quality metric value unit 300 according to an embodiment of the present invention. The quality metric value unit 300 may be used to implement the quality metric value unit 140 illustrated in FIG. 1. The quality metric value unit 300 includes a manager unit 310. The manager unit 310 interfaces with and transmits information between other components in the quality metric value unit 300 and/or other components. For example, the manager unit 310 may receive parameter values of a design solution from a component in a system designer. As stated earlier, the scalar quality metric may be based on one or more types of parameters which may include timing parameters such as worst slack in a timing domaim, clock frequency in a timing domain, sum of slacks of all failing paths in a timing domain, sum of slacks of all paths in a timing domain, sum of slacks of all negative slack connections in a timing domain, or other timing measurements. The parameters may also or alternatively include power parameters such as the amount of power required to operate resources in a power domain. It should be appreciated that a domain may be given other definitions.

The quality metric value unit 300 includes a summing unit 320. The summing unit 320 may operate to sum parameter values originating from components of a system designer that have not been modified by other components of the quality metric value unit 300. Alternatively, the summing unit 320 may operate to sum the parameters after some or all of the parameters have been normalized, modified, and/or weighted by other components in the quality metric value unit 300.

According to an example embodiment of the quality metric unit 300, the summing unit 320 may receive a worst slack for each timing domain in a system design as parameters. The summing unit 320 computes the simple sum of domain worst slacks generating an "average slack"-like metric that weights performance of all domains equally. The scalar quality metric value generated in this embodiment is an improvement over the worst slack formulation used in the past because, in this scalar quality metric formulation, all domains contribute to the final metric value, not just the worst performing domain.

The quality metric value unit 300 includes a function unit 330. The function unit 330 may modify a parameter (synonymous with parameter value) received by the manager unit 310 by applying a function to the parameter. The function may operate to modify parameters such that not all domains are considered equally when generating a scalar quality metric value. For example, large improvements in a one domain that already satisfies its constraints will not be allowed to cover large degradations in other domains that marginally satisfy or fail to satisfy their constraints. The modified parameters may then be summed by the summing unit 320. It should be noted that the function applied by the function unit 330 to modify a parameter may actually be a function of a set of parameters received from the manager unit 310, and the particular parameter that is being modified. For example, in some embodiments, a different function may be applied depending on the type of domain being considered or the size of the domain. In a further embodiment, a designer may define or modify the properties of the functions to be applied, so they can tune the scalar quality metric as they desire.

Figure 4:
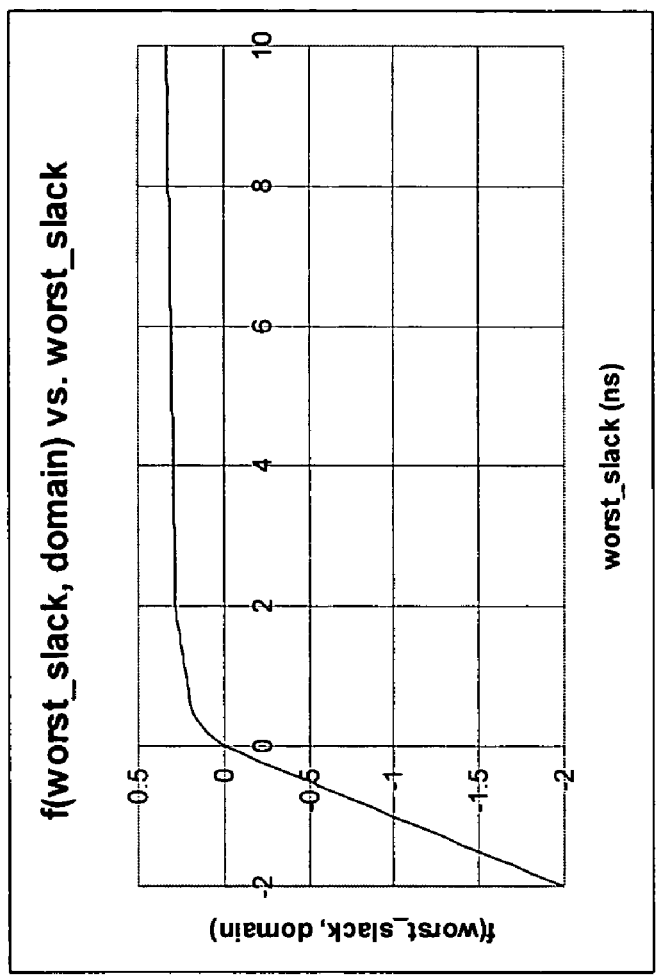
FIG. 4 is a chart illustrating a sub-linear function according to an embodiment of the present invention.

According to an example embodiment of the quality metric unit 300, a sub-linear function may be applied by the function unit 330 on worst slack parameters received by the manager unit 310. The sub-linear function emphasizes improvements in negative slack domains over improvements in positive slack domains, and improvements in domains with small positive slacks over improvements in domains with large positive slacks. Slack improvements in domains with a large amount of slack are not weighted as heavily as slack improvements in domains that are failing or close to failing. FIG. 4 illustrates an exemplary sub-linear function that may be applied by the function unit 330 to the worst slack parameter.

Referring back to FIG. 3, the quality metric unit 300 includes a normalization unit 340. The normalization unit 340 may operate to normalize a parameter with respect to properties or characteristics in its corresponding domain. The normalized parameter may then be modified by having the function unit 330 apply a function to the normalized parameter. After that, the modified normalized parameter may be summed with other parameters (each possibly modified and/or normalized) by the summing unit 320. It should be noted that the normalization unit 340 is a special case of the more generic function unit 330. The function unit 330 can also perform normalization (since it can apply any arbitrary function). However, normalization is discussed separately in this embodiment to help clarify this common sub-function of the function unit.

Figure 5:
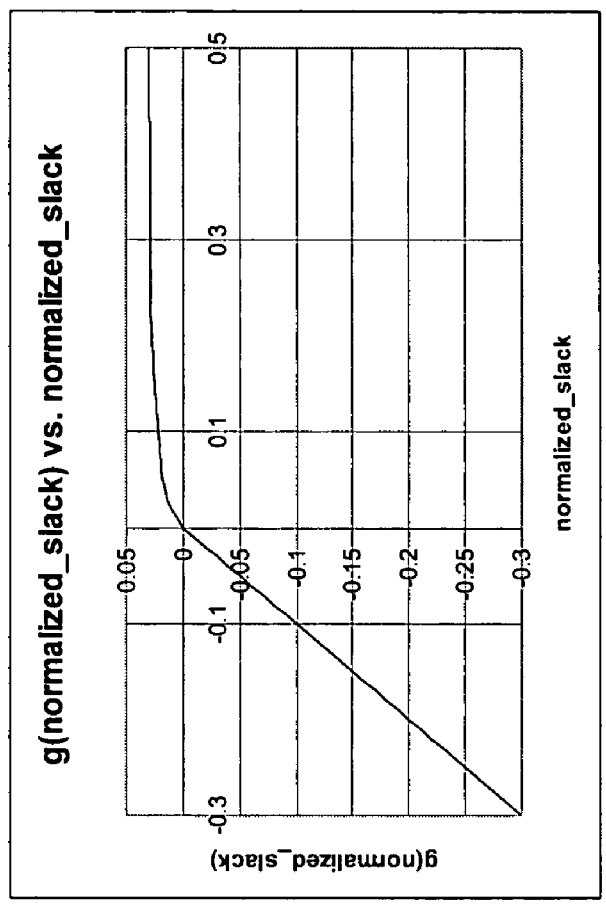
FIG. 5 is a chart illustrating a sub-linear function according to a second embodiment of the present invention.

According to an embodiment of the quality metric unit 300, worst slack parameters received by the manager unit 310 may first be normalized by the normalization unit 340. The worst slack for a domain may be divided by an appropriate required time. According to one embodiment, the required time may be the clock period of a clock associated with the domain. Normalization of the worst slack achieves the effect of magnifying slacks associated with faster domains. This allows faster domains that are affected more by a given absolute slack change than slower domains to be "fairly" considered in the scalar quality metric value. FIG. 5 illustrates an exemplary sub-linear function that may be applied by the function unit 330 to the normalized worst slack parameter. The "modified" normalized worst slack parameters may then be summed. In other embodiments, a single domain may have a multiplicity of required times (a timing transfer that has 1 cycle to pass data will have a different required time than timing transfers that have 2 or 0.5 cycles to pass data). To accommodate this, within a domain, for each type of timing transfer, the worst slack among the respective paths for that transfer can be computed and normalized by the corresponding required time for that type of transfer (this is an example of using a different function to process a parameter, based on other parameters, as discussed when describing the function unit). The worst normalized slack across all transfer types, for the domain, will be the worst normalized slack across the domain (which can be further processed as discussed earlier). This selection of the worst normalized slack in each domain can be performed by the manager unit 310. In another embodiment, it can be performed by the function unit 330 by the appropriate processing of parameter values (so that only the worst normalized slack in each domain contributes to the sum performed by the summing unit 320). This is possible because the function applied to each parameter can be a function of all the parameter values (as discussed earlier).

Referring back to FIG. 3, the quality metric unit 300 includes a weighting unit 350. The weighting unit 350 may apply a weight to a parameter or modified parameter of a domain. It should be noted that the weighting unit 350, like the normalization unit 340, is a special case of the more generic function unit 330. The weight may be specified by a designer (or user of the logic design tool) or the weight may be determined by the logic design tool. The former would allow a scalar quality metric generated to favor improvements in domains selected by the designer. An example of the latter is the "selection" of the worst normalized slack in each domain by the function unit 330 (as discussed earlier). This can be achieved by applying weights of 0 to all the parameters which should be ignored and a weight of 1 to the parameters which should be considered. It should be also noted that the weighting unit 350 may apply a weight before a parameter has been modified by a function, after a parameter has been modified, or after a normalized parameter has been modified. The various units in 300 may operate on the outputs of the same units, in different combinations.

The weighting unit 350 may be used to control emphasis on different timing corners. That is, when multiple timing corners are introduced to model process/operating condition variations, each timing domain may be replicated into several conceptual instances (one for each corner). The resulting domains associated with a particular corner may be weighted differently than timing domains at another corner to favor solutions that meet timing in certain areas of the process space. Alternatively, timing performance of particular domains at particular corners may be prioritized. Absolute slacks at different timing corners should generally be interpreted differently since delays scale between corners. Weighting schemes which balance slack margins across corners may be favored in some embodiments.

The quality metric unit 300 has been described to generate a scalar quality metric based on parameters associated with two or more clock domains in a design solution. It should be appreciated that the quality metric unit 300 may also generate a scalar quality metric based on parameters associated with paths and other constructs, using other metrics than slacks (for example, clock frequency). For example, the slacks of failing paths, the slacks of all paths, the slacks of all connections, and the slacks of all negative-slack connections can be of interest. Since delay models may be inaccurate, picking solutions that reduce the number of failing paths (or connections) and the severity of failing or timing marginal paths can translate into better design performance (statistically, those paths have a chance of being performance limiting). Also, since design timing closure may involve interaction between the logic design tool and a designer, choosing solutions with fewer failing paths can result in a better starting point for optimization (less failures to consider). The techniques discussed so far are advantageous for path-level performance metrics. Without these techniques, a major problem with path-level or connection-level metrics is they can be only loosely related to design performance. Design performance is determined by worst paths (one in each timing domain) and not the collection of all paths or all failing paths. Hence, reducing the magnitude of all failures or the number of failures (potentially at the expense of the worst path) is generally de-prioritizing design performance. Also, domains with more failing paths (or more paths in general) will tend to inappropriately receive more focus with sum-over-paths types of metrics. When embodiments of the present invention are applied to paths, these issues may be addressed. In some embodiments, the techniques can focus attention on failing paths more than passing paths and marginally passing paths more than generously passing paths (using a sub-linear function approach). Also, in other embodiments, the techniques can focus attention only on the worst path, in each domain (using an appropriate weighting scheme). Also, in some embodiments, the techniques may be applied to all paths in one pass. While, in other embodiments, the techniques may be applied hierarchically; that is, within each domain, they can be applied to all the relevant paths, to compute a path-level performance metric value for each domain. The techniques can then be applied to compute a single metric value for the design based on the "domain" path-level performance metric values. If necessary, some embodiments may use the techniques to fairly "weight" domains, for example, by normalizing by the number of paths in each domain.

It should also be appreciated that the quality metric unit 300 can operate independently from the units that supply the parameter values. For example, a technique for accounting for intra-corner delay variation is to use a conservative timing analysis based on min/max delay bounds for each resource to account for delay uncertainty. A conservative timing analysis computes "pessimistic" slacks for each domain, and those "pessimistic" slacks can be used with the same techniques presented above to compute a "pessimistic" scalar quality metric value, if necessary.

In the examples provided, a scalar quality metric is generated from parameters associated with two or more domains, where each domain provides timing parameters such as worst slack. It should be appreciated that the scalar quality metric may be based on power parameters or both timing and power parameters. For example, two different functions may be used to compute the scalar quality metric, one for timing and one for power. This offers the flexibility to specify a tradeoff between timing and power that determines how much absolute slack change or normalized slack change, an absolute power reduction or normalized power reduction should offset. According to one embodiment, the power parameters may be de-weighted so that they only compete with timing parameters when all timing domains are meeting timing. in some embodiments, the inverse of power or the negative of power may be used to match the "sense" of the power terms with that of the timing slacks (larger numbers are better). It should be noted that all the previous techniques described with respect to timing can be applied to power. For example, a super-linear function can be used to prioritize power reduction if power is exceeding some constraint, but de-prioritize power reduction when a power constraint is satisfied.

Figure 6:
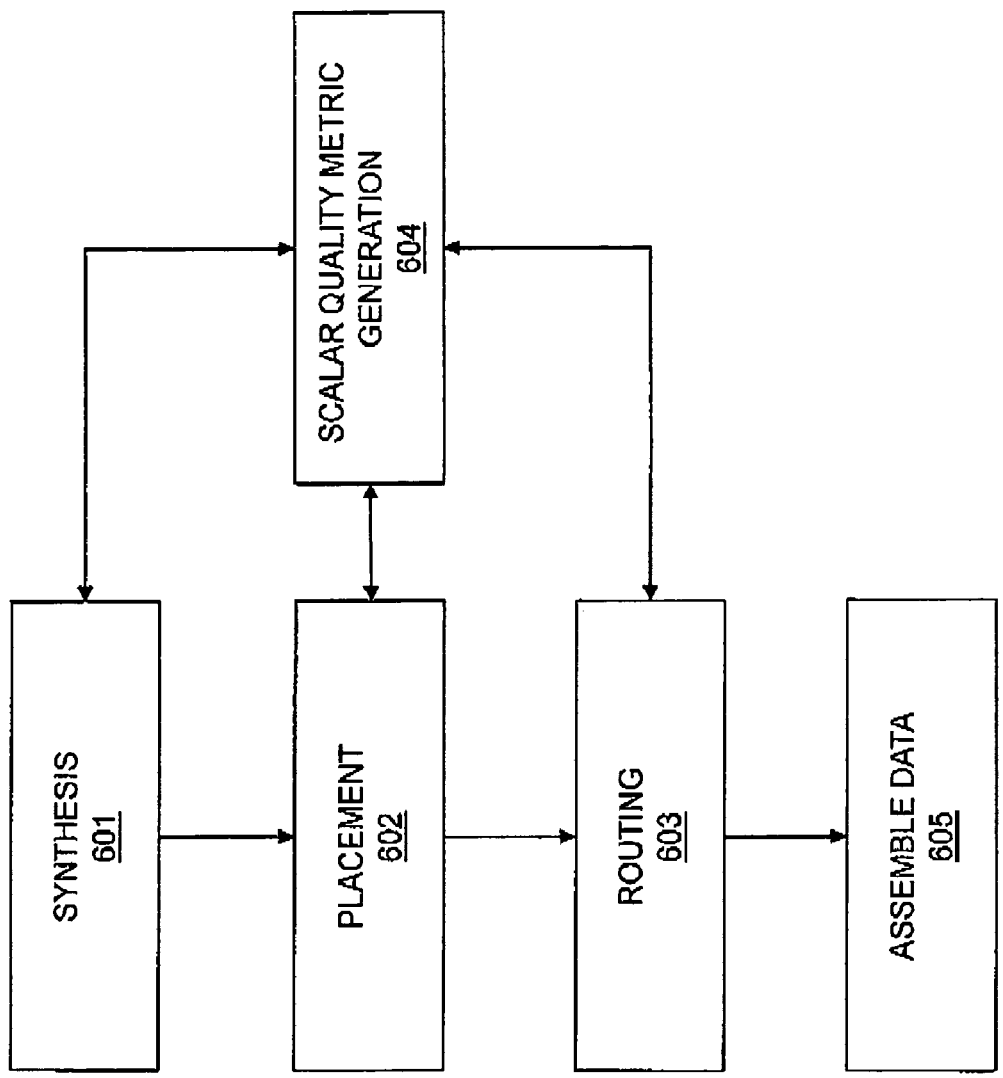
FIG. 6 is a flow chart illustrating a method for designing a system on a FPGA according to an embodiment of the present invention.

FIG. 6 is a flow chart illustrating a method for designing a system on a FPGA according to an embodiment of the present invention. At 601, the system is synthesized. Synthesis includes generating a logic design of the system to be implemented by a target device. According to an embodiment of the present invention, synthesis generates an optimized logical representation of the system from an HDL design definition. Synthesis also includes mapping the optimized logic design. Mapping includes determining how to implement logic gates and logic elements in the optimized logic representation with specific resources on the target device. According to an embodiment of the present invention, a netlist is generated from mapping. This netlist may be an optimized technology-mapped netlist generated from the HDL.

At 602, the mapped logical system design is placed. Placement works on the optimized technology-mapped netlist to produce a placement for each of the functional blocks. According to an embodiment of the present invention, placement includes fitting the system on the target device by determining which resources on the target device are to be used for specific logic elements and functional blocks.

At 603, it is determined which routing resources should be used to connect the functional blocks in the system. According to an embodiment of the present invention, routing may be performed in response to routing constraints provided.

At 604, scalar quality metrics are generated. The scalar quality metric is computed for a design solution generated by the synthesis, placement, and/or routing procedures 601, 602, and/or 603. According to an embodiment of the present invention, the scalar quality metric reflects a quality of the design solution with respect to two or more domains in the system. The scalar quality metric may be based on one or more types of parameters from the domains. The parameters may include timing parameters such as worst slack in each domaim, clock frequency in each domain, sum of slacks of all failing paths in each domain, sum of slacks of all paths in each domain, sum of slacks of all negative slack connections in each domain, or other timing measurements. The parameters may also or alternatively include power parameters such as the amount of power required to operate resources in each domain. The domains in the design solution may correspond to, for example, physical locations on the target device, or components associated with a clock or function. The synthesis, placement, and/or routing procedures 601, 602, and/or 603 may utilize the scalar quality metric to evaluate design solutions to compare and select a best design solution generated.

At 605, an assembly procedure is performed. The assembly procedure involves creating a data file that includes information determined by the compilation procedure described by 601-604. The data file may be a bit stream that may be used to program a target device.

FIG. 7 is a flow chart illustrating a method for generating a scalar quality metric according to an embodiment of the present invention. The procedure described with reference to FIG. 7 may be implemented at 604 as described in FIG. 6. At 701, parameters are identified that correspond to a plurality of domains in a design solution.

At 702, each of the parameters is normalized with respect to a corresponding property or characteristic in its corresponding domain. According to an embodiment of the present invention, all the parameters may be left unnormalized by normalizing them with 1.

At 703, a function is applied. According to an embodiment of the present invention, a sub-linear function is applied to each of the normalized parameters to modify the normalized parameters. The function may operate to modify the normalized parameter values such that not all domains are "treated" equally when generating a scalar quality metric value. For example, large improvements in one domain that already satisfies its constraints will not be allowed to cover degradations in other domains that marginally satisfy or fail to satisfy their constraints.

At 704, weights are applied. According to an embodiment of the present invention, designer specified weights are applied to the modified normalized parameters. This allows a scalar quality metric to be generated which favors improvements in domains selected by the designer.

At 705, sums are determined. According to an embodiment of the present invention, the weighted modified normalized parameters are summed to generate a scalar quality metric for the design solution.

FIG. 7 illustrates a plurality of procedures performed sequentially. It should be appreciated that not all of the procedures listed are required for generating a scalar quality metric. For example, a scalar quality metric may be generated by summing the parameters identified at 701 directly without performing 702-704. Alternatively, a scalar quality metric may be generated by summing the modified parameters identified at 703 which have not been normalized as described in 702 and which have not been weighted as described at 704. It should be appreciated that one or more of any of the procedures 701 and 705 may be utilized to generate the scalar quality metric for the design solution.

Furthermore, it should be appreciated that procedures 701-705 or a subset of procedures 701-705 may be performed separately on two or more types of parameters that correspond to two or domains in a design solution. For example, procedures 701-705 or a subset of procedures 701-705 may be performed on timing parameters and power parameters. The results of both procedures may be reflected in a scalar quality metric of a design solution.

FIGS. 6 and 7 are flow charts illustrating methods according to embodiments of the present invention. Some of the techniques illustrated in these figures may be performed sequentially, in parallel, or in an order other than that which is described. It should be appreciated that not all of the techniques described are required to be performed, that additional techniques may be added, and that some of the illustrated techniques may be substituted with other techniques.

The techniques above have been described with reference to designing a field programmable gate array. It should be appreciated that the techniques (for synthesis, placement, routing, design space exploration, etc.) may be used in any CAD tool for the creation/processing/optimization/implementation of any logic design, such as that encountered in the creation of application specific integrated circuits (ASICs), etc.

Embodiments of the present invention may be provided as a computer program product, or software, that may include an article of manufacture on a machine accessible or machine readable medium having instructions. The instructions on the machine accessible or machine readable medium may be used to program a computer system or other electronic device. The machine-readable medium may include, but is not limited to, floppy diskettes, optical disks, CD-ROMs, and magneto-optical disks or other type of media/machine-readable medium suitable for storing or transmitting electronic instructions. The techniques described herein are not limited to any particular software configuration. They may find applicability in any computing or processing environment. The terms "machine accessible medium" or "machine readable medium" used herein shall include any medium that is capable of storing, encoding, or transmitting a sequence of instructions for execution by the machine and that cause the machine to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

In the foregoing specification, embodiments of the invention have been described with reference to specific exemplary embodiments thereof. It will, however, be evident that various modifications and changes may be made thereto without departing from the broader spirit and scope of the embodiments of the invention. The specification and drawings are, accordingly, to be regarded in an illustrative rather than restrictive sense.

What is claimed is:

1. A method for generating a scalar quality metric value for a design solution of a system, comprising:
   identifying a first parameter for describing a characteristic associated with a first domain of the design solution implemented on an integrated circuit;

identifying a second parameter for describing characteristic associated with a second domain of the design solution implemented on the integrated circuit; and generating the scalar quality metric for the design solution implemented on the integrated circuit based upon the first parameter and the second parameter, wherein at least one of the identifying and the generating is performed by a processor.

2. The method of claim 1, wherein the first and the second parameters are associated with qualities of the design solution associated with the integrated circuit.

3. The method of claim 2, wherein one of the parameters is associated with a scalar quality metric value.

4. The method of claim 2, wherein the first and second parameters comprises a first set of parameters associated with timing quality and a second set of parameters associated with power quality.

5. The method of claim 1, wherein the generating comprises summing the first parameter with the second parameter.

6. The method of claim 1, wherein the first and the second domains comprise timing domains.

7. The method of claim 6, wherein the timing domains include one or more components associated with a path.

8. The method of claim 6, wherein at least one of the timing domains includes component associated with a connection.

9. The method of claim 5, wherein at least one of the timing domains includes component associated with a region of a logic device.

10. The method of claim 1, wherein the first domain comprises a components associated with a clock.

11. The method of claim 1, wherein the first and the second domains comprise power domains.

12. The method of claim 11, wherein at least one of the power domains includes a component associated with a hierarchy-level of a design of the integrated circuit.

13. The method of claim 1, wherein the generating comprises:
applying a function to modify one of the first and the second parameters; and
processing the parameter that has been modified.

14. The method of claim 13 further comprising:
evaluating the parameter that has been modified with respect to other parameters.

15. The method of claim 13, wherein the applying comprises normalizing the one of the first and the second parameters.

16. The method of claim 15, wherein the normalizing comprises normalizing a slacks value by a corresponding required time value.

17. The method of claim 13, wherein the applying comprises multiplying the one of the first and the second parameters by an associated weight.

18. The method of claim 17, wherein the multiplying is associated with a weight, wherein the weight is a function of a set of parameters and the parameter that has been modified.

19. The method of claim 17, wherein the multiplying further comprises multiplying a weight of 0 or 1 depending on whether the one of the first and the second parameters is to be selected.

20. The method of claim 17, wherein the associated weight is a function of a timing corner associated with the one of the first and the second parameters.

21. The method of claim 1, further comprising applying a sub-linear function on the first and the second parameters.

22. The method of claim 1, further comprising applying a super-linear function to the first and the second parameters.

23. The method of claim 1, further comprising applying a function that is determined based in part on the first and the second parameters.

24. The method of claim 1, further comprising applying a function to one of the first and the second parameters, wherein the function is determined based in part on a domain associated with the one of the first and the second parameters.

25. The method of claim 1, further comprising applying a customized function responsive to receipt of a logic design.

26. A method for generating a scalar quality metric value for a design solution of a system, comprising:
identifying a first parameter for describing a characteristic associated with a first domain of the design solution implemented on an integrated circuit, wherein the first parameter is associated with a timing slack in the first domain of the design solution;
identifying a second parameter for describing a characteristic associated with a second domain of the design solution implemented on the integrated circuit; and
generating the scalar quality metric for the design solution implemented on the integrated circuit based upon the first parameter and the second parameter, wherein at least one of the identifying and the generating is performed by a processor.

27. The method of claim 26, wherein the timing slack is a worst timing slack among timing slack computed in the first domain.

28. The method of claim 26, wherein the timing slack is computed using an analysis that considers intra-corner delay variation.

29. The method of claim 1, wherein the first parameter is associated with a clock frequency.

30. The method of claim 26, wherein the timing slack includes a sum of connection slacks.

31. The method of claim 26, wherein the timing slack includes a sum of path slacks.

32. The method of claim 26 wherein the timing slack includes a sum of negative-slack connection slacks.

33. The method of claim 26, wherein the timing slack includes a sum of failing path slacks.

34. The method of claim 1, wherein the first parameter is associated with power corresponding to the first domain.

35. The method of claim 1, wherein the first parameter is associated with power corresponding to a domain relative to power constraint.

36. A scalar quality metric unit, comprising:
a manager unit operable to receive parameters corresponding to two or more domains of a design solution implemented on an integrated circuit that characterize design solution quality; and
a summing unit operable to generate a scalar quality metric for the design solution implemented on the integrated circuit by summing the parameters corresponding to the two or more domains.

37. The scalar quality metric unit of claim 36, further comprising a function unit operable to apply a sub-linear function to the parameters before the parameters are summed.

38. The scalar quality metric unit of claim 36, further comprising a normalization unit operable to normalize the parameters before a sub-linear function is applied to the parameters.

39. The scalar quality metric unit of claim 36, further comprising a weighting unit operable to apply a weight to the parameters before the parameters are summed.

40. The scalar quality metric unit of claim 36, wherein the parameters are each associated with a timing property in each domain.

41. The scalar quality metric unit of claim 36, wherein the parameters are each associated with a power property in each domain.

42. A non-transitory computer-readable medium storing sequences of instructions, the sequences of instructions including instructions which when executed by a computer cause the computer to perform:
   identifying a first parameter for describing a first characteristic of a first domain of a design solution implemented on an integrated circuit and a second parameter for describing a second characteristic of a second domain of the design solution implemented on the integrated circuit; and
   generating a scalar quality metric for the design solution implemented on a the integrated circuit based on the first parameter and the second parameter.

43. The non-transitory computer-readable medium of claim 42, wherein the first parameter is associated with a timing slack in the first domain.

44. The non-transitory computer-readable medium of claim 43, wherein the first parameter is associated with a clock frequency.

45. The non-transitory computer-readable medium of claim 42, wherein generating the scalar quality metric comprises summing the first parameter and the second parameter.

46. The non-transitory computer-readable medium of claim 42, further comprising applying a sub-linear function to the first and the second parameters.

47. The non-transitory computer-readable medium of claim 42, further comprising normalizing the first and the second parameters before a sub-linear function is applied to the first and second parameters.

48. The non-transitory computer-readable medium of claim 42, further comprising applying a weight to the first and the second parameters.

* * * * *